US009680462B2

(12) United States Patent
Petersen et al.

(10) Patent No.: US 9,680,462 B2
(45) Date of Patent: Jun. 13, 2017

(54) SYSTEM AND METHOD FOR VOLTAGE REGULATION WITH ZERO VOLTAGE REDUCTION AND AUTOTRANSFORMER MODES

(71) Applicant: Legend Power Systems Inc., Burnaby (CA)

(72) Inventors: Mark Petersen, Vancouver (CA); Jonathan Stewart Thomson, Vancouver (CA)

(73) Assignee: LEGEND POWER SYSTEMS INC., Burnaby (CA)

( * ) Notice: Subject to any disclaimer, the term of this patent is extended or adjusted under 35 U.S.C. 154(b) by 145 days.

(21) Appl. No.: 14/644,655

(22) Filed: Mar. 11, 2015

(65) Prior Publication Data

US 2016/0269019 A1     Sep. 15, 2016

(51) Int. Cl.
*H02M 5/10*     (2006.01)
*H03K 17/13*    (2006.01)
*H02M 5/12*     (2006.01)
*H02M 5/18*     (2006.01)
*G05F 1/14*     (2006.01)

(52) U.S. Cl.
CPC ............. *H03K 17/13* (2013.01); *G05F 1/14* (2013.01); *H02M 5/10* (2013.01); *H02M 5/12* (2013.01); *H02M 5/18* (2013.01)

(58) Field of Classification Search
CPC ............. H02M 5/18; H02M 5/12; H02M 5/10
See application file for complete search history.

(56) References Cited

U.S. PATENT DOCUMENTS

| 2,445,577 A | 7/1948 | Haug |
| 2,602,150 A | 7/1952 | Hauck |
| 3,206,569 A | 9/1965 | McCarty |

(Continued)

FOREIGN PATENT DOCUMENTS

WO     2009137908     11/2009

OTHER PUBLICATIONS

European Search Report, dated Jul. 26, 2016.

*Primary Examiner* — Timothy J Dole
*Assistant Examiner* — Ishrat Jamali
(74) *Attorney, Agent, or Firm* — Bereskin & Parr LLP/S.E.N.C.R.L., s.r.l.

(57) ABSTRACT

Various embodiments are described herein for methods and systems of regulating incoming voltage supplied from a utility power supply to a load. In one example embodiment, a voltage regulator adapted to be electrically interposed between the utility power supply and the load, each having at least one phase, is provided. The voltage regulator comprises an autotransformer having, for each phase, a series winding and a regulating winding, where the regulating winding has a plurality of taps and the series winding has a load side for connection to the load and a supply side for connection to the utility power supply. The voltage regulator comprises a controller coupled to the autotransformer, where the controller is configured to operate the voltage regulator in a zero voltage reduction mode and an autotransformer mode, and where the controller comprises a zero voltage reduction mode switch connected across a first subset of at least two taps of each regulating winding and a normally closed contactor connected across a second subset of at least two taps of each regulating winding.

22 Claims, 6 Drawing Sheets

(56) References Cited

U.S. PATENT DOCUMENTS

| | | | | |
|---|---|---|---|---|
| 3,869,202 | A | * | 3/1975 | Tabata ................ G03G 15/234 |
| | | | | 271/3.19 |
| 4,513,224 | A | | 4/1985 | Thomas |
| 5,422,545 | A | * | 6/1995 | Felper ................ H05B 41/2855 |
| | | | | 315/209 R |
| 6,137,277 | A | | 10/2000 | Rajda |
| 6,906,476 | B1 | | 6/2005 | Beatenbough |
| 2002/0093774 | A1 | * | 7/2002 | Chung ................ H01H 9/542 |
| | | | | 361/2 |
| 2011/0121796 | A1 | * | 5/2011 | Dunford ................ H01F 29/04 |
| | | | | 323/255 |
| 2013/0134802 | A1 | | 5/2013 | Taylor |

* cited by examiner

SYSTEM AND METHOD FOR VOLTAGE REGULATION WITH ZERO VOLTAGE REDUCTION AND AUTOTRANSFORMER MODES

FIELD

The described embodiments relate to systems and methods for regulating incoming voltage from a utility power supply for delivery to a facility, and in particular, to systems and methods for regulating incoming voltage from a utility power supply to a facility in response to electrical supply conditions to ensure stability is provided to the system during start up and transient conditions.

BACKGROUND

A voltage regulation system is used to regulate the incoming voltage from a utility power supply to control the voltage supplied to one or more loads. A voltage regulation system typically includes a transformer, and corresponding control circuitry, which is used to step up or step down the incoming voltage before delivery to the load.

A conventional transformer used at high power levels in unknown or unregulated state, even for a few cycles, can be very damaging to the equipment used in the voltage regulation system and needs to be avoided.

SUMMARY

In a first aspect, in at least one embodiment described herein, there is provided a voltage regulator adapted to be electrically interposed between the utility power supply and the load, each having at least one phase, where the voltage regulator is configured to regulate the voltage supplied from the utility power supply to the load. The voltage regulator generally comprises an autotransformer having, for each phase, a series winding and a regulating winding, the regulating winding having a plurality of taps and the series winding having a load side for connection to the load and a supply side for connection to the utility power supply; a controller coupled to the autotransformer, the controller configured to selectably operate the voltage regulator in at least a zero voltage reduction mode and an autotransformer mode; the controller having a zero voltage reduction mode switch connected between a first subset of at least two of the plurality of taps of the regulating winding of each phase; and the controller having a normally closed contactor connected across a second subset of at least two of the plurality of taps of the regulating winding of each phase to provide an alternate current path to the zero voltage reduction mode switch.

In some embodiments, for each phase, the normally closed contactor is connected in parallel to the zero voltage reduction mode switch.

In some embodiments, in the zero voltage reduction mode, each zero voltage reduction mode switch and each normally closed contactor provide a short circuit across the corresponding subsets of at least two taps of each regulating winding.

In some embodiments, the controller comprises a plurality of tap selection switches, and for each phase, a tap selection switch is provided between the load side of the series winding and the plurality of taps of the regulating winding.

In some embodiments, in the autotransformer mode, each tap selection switch connects the load side of the series winding to one of the plurality of taps of the regulating winding, and the zero voltage reduction mode switch and the normally closed contactor are disconnected from the corresponding subsets of at least two taps of the regulating winding.

In some embodiments, at startup, the normally closed contactor provides a current path across the second subset of at least two taps of each regulating winding, the zero voltage reduction mode switch is open, and the voltage at the utility power supply is supplied to the load without reduction.

In some embodiments, during transition from the zero voltage reduction mode to the autotransformer mode, each normally closed contactor is disconnected, each zero voltage reduction mode switch is opened, each tap selection switch is connected between the load side of the series winding and a smallest voltage reduction tap of the plurality of taps of the regulating winding, and the voltage at the utility power supply is reduced by an amount corresponding to the smallest voltage reduction tap before supplying to the load.

In some embodiments, during transition from the autotransformer mode to the zero voltage reduction mode, each tap selection switch is disconnected from the smallest voltage reduction tap of the regulating winding, each zero voltage reduction mode switch is closed providing a current path across the two taps of each regulating winding, each normally closed contactor is connected to the two taps of each regulating winding, and the voltage at the utility power supply is supplied to the load without reduction.

In some embodiments, if a failure condition is detected, each tap selection switch is opened, each zero voltage reduction mode switch is subsequently closed, and each normally closed contactor is connected to the second subset of at least two taps of each regulating winding to provide a current path across the corresponding taps.

In various embodiments, when power is applied to the normally closed contactor, the normally closed contactor is disconnected from the second subset of at least two taps, and when power is removed from the normally closed contactor, the normally closed contactor is connected to the second subset of at least two taps.

In some embodiments, the voltage regulator also comprises an auxiliary zero voltage reduction mode switch connected between a third subset of at least two of the plurality of taps of each regulating winding. In such embodiments, the auxiliary zero voltage reduction mode switch, when closed, provides a current path across the third subset of at least two taps of each regulating winding.

In another aspect, in at least one embodiment described herein, there is provided a method of regulating voltage supplied from a utility power supply to a load. The method generally comprises selectably controlling a normally closed contactor provided across a first subset of at least two taps of each regulating winding of an autotransformer. In this embodiment, the autotransformer comprises, for each phase, a series winding, a regulating winding and a plurality of taps on the regulating winding, and the autotransformer is selectably operable in at least a zero voltage reduction mode and an autotransformer mode by a controller coupled to the autotransformer. In addition, in this embodiment, the autotransformer and the controller are electrically interposed between the utility power supply and the load, each having, at least one phase.

Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the applicant's teachings described herein, reference will now be made, by way of example only, to the accompanying drawings which show at least one exemplary embodiment, and in which.

Figure 1:
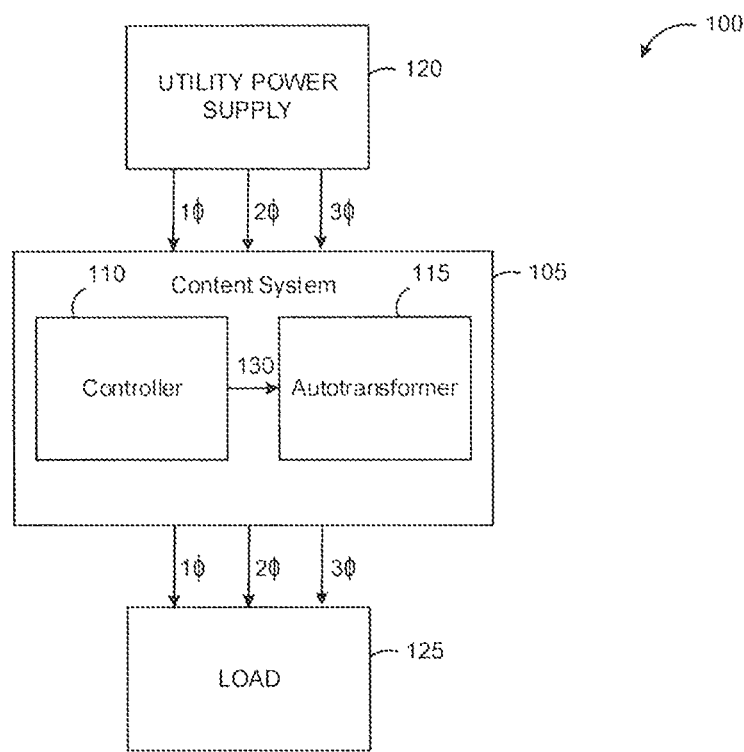
FIG. 1 illustrates a block diagram of a voltage regulation system according to an example embodiment.

For simplicity and clarity of illustration, elements shown in the figures have not necessarily been drawn to scale. For example, the dimensions of some of the elements may be exaggerated relative to other elements for clarity. Furthermore, where considered appropriate, reference numerals may be repeated among the figures to indicate corresponding or analogous elements.

DESCRIPTION OF EXEMPLARY EMBODIMENTS

Various apparatuses or processes will be described below to provide an example of at least one embodiment of the claimed subject matter. No embodiment described below limits any claimed subject matter and any claimed subject matter may cover processes, apparatuses, devices or systems that differ from those described below. The claimed subject matter is not limited to apparatuses, devices, systems or processes having all of the features of any one apparatus, device, system or process described below or to features common to multiple or all of the apparatuses, devices, systems or processes described below. It is possible that an apparatus, device, system or process described below is not an embodiment of any claimed subject matter. Any subject matter that is disclosed in an apparatus, device, system or process described below that is not claimed in this document may be the subject matter of another protective instrument, for example, a continuing patent application, and the applicants, inventors or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Also, the description is not to be considered as limiting the scope of the example embodiments described herein.

It should also be noted that the terms "coupled" or "coupling" as used herein can have several different meanings depending in the context in which the term is used. For example, the term coupling can have a mechanical or electrical connotation. For example, as used herein, the terms "coupled" or "coupling" can indicate that two elements or devices can be directly connected to one another or connected to one another through one or more intermediate elements or devices via an electrical element, electrical signal or a mechanical element such as but not limited to, a wire or a cable, for example, depending on the particular context.

It should be noted that terms of degree such as "substantially", "about" and "approximately" as used herein mean a reasonable amount of deviation of the modified term such that the end result is not significantly changed. These terms of degree should be construed as including a deviation of the modified term if this deviation would not negate the meaning of the term it modifies.

Furthermore, the recitation of any numerical ranges by endpoints herein includes all numbers and fractions subsumed within that range (e.g. 1 to 5 includes 1, 1.5, 2, 2.75, 3, 3.90, 4, and 5). It is also to be understood that all numbers and fractions thereof are presumed to be modified by the term "about" which means a variation up to a certain amount of the number to which reference is being made if the end result is not significantly changed.

The various embodiments of the devices, systems and methods described herein may be implemented using a combination of hardware and software. These embodiments may be implemented in part using computer programs executing on programmable devices, each programmable device including at least one processor, an operating system, one or more data stores (including volatile memory or non-volatile memory or other data storage elements or a combination thereof), at least one communication interface and any other associated hardware and software that is necessary to implement the functionality of at least one of the embodiments described herein. For example, and without limitation, the computing device may be a server, a network appliance, an embedded device, a computer expansion module, a personal computer, a laptop, a personal data assistant, a cellular telephone, a smart-phone device, a tablet computer, a wireless device, a programmable logic controller, or any other computing device capable of being configured to carry out the methods described herein. The particular embodiment depends on the application of the computing device.

In some embodiments, the communication interface may be a network communication interface, a USB connection or another suitable connection as is known by those skilled in the art. In other embodiments, the communication interface may be a software communication interface, such as those for inter-process communication (IPC). In still other embodiments, there may be a combination of communication interfaces implemented as hardware, software, and a combination thereof.

In at least some of the embodiments described herein, program code may be applied to input data to perform at least some of the functions described herein and to generate output information. The output information may be applied to one or more output devices, for display or for further processing.

At least some of the embodiments described herein that use programs may be implemented in a high level procedural or object oriented programming and/or scripting language or both. Accordingly, the program code may be written in C, Java, SQL or any other suitable programming language and may comprise modules or classes, as is known to those skilled in object oriented programming. However, other programs may be implemented in assembly, machine language or firmware as needed. In either case, the language may be a compiled or interpreted language.

The computer programs may be stored on a storage media (e.g. a computer readable medium such as, but not limited to, ROM, magnetic disk, optical disc) or a device that is readable by a general or special purpose computing device. The program code, when read by the computing device, configures the computing device to operate in a new, specific and predefined manner in order to perform at least one of the methods described herein.

Furthermore, some of the programs associated with the system, processes and methods of the embodiments described herein are capable of being distributed in a computer program product comprising a computer readable medium that bears computer usable instructions for one or more processors. The medium may be provided in various forms, including non-transitory forms such as, but not limited to, one or more diskettes, compact disks, tapes, chips, and magnetic and electronic storage. In alternative embodiments the medium may be transitory in nature such as, but not limited to, wire-line transmissions, satellite transmissions, internet transmissions (e.g. downloads), media, digital and analog signals, and the like. The computer useable instructions may also be in various formats, including compiled and non-compiled code.

The various embodiments disclosed herein generally relate to improved techniques for regulating incoming voltage from a utility power supply for delivery to a facility. In particular, the various embodiments disclosed herein generally relate to an improved voltage regulation system, including an improved autotransformer and a controller for regulating voltage received from a utility power supply.

Reference is first made to FIG. 1, which illustrates a block diagram of a voltage regulation system 100 in accordance with an example embodiment. Voltage regulation system 100 includes a voltage regulator 105, a utility power supply 120 and a load 125. As illustrated, voltage regulator 105 is interposed between the utility power supply 120 and the load 125, and selectively regulates incoming voltage from the utility power supply 120 before providing it to the load 125. In the various embodiments illustrated herein, the utility power supply 120 is a three phase supply and load 125 is a three phase load.

Even though the voltage regulation system 100 disclosed herein includes a three phase utility power supply 120 and a three phase load 125, the teachings and the advantages disclosed herein are also applicable to a single phase voltage regulation system 100 including a single phase utility power supply 120 and a single phase load 125.

Voltage regulator 105 includes an autotransformer 115 coupled to a controller 110. An autotransformer, such as the autotransformer 115, is any transformer having at least two windings, where the first winding or series winding is connected in series with the load and the second winding or regulating winding is connected between the load and the return of the load (for a single phase system) or to a neutral point (for a three phase system) which may or may not be connected to the load. In some embodiments, the autotransformer 115 has more than two windings, including a series winding, a regulating winding, and other windings, which may be used for additional regulating functionalities and/or other purposes.

In the various embodiments illustrated herein, autotransformer 115 is a three phase autotransformer, where the series winding is connected in series between the utility power supply 120 and the load 125, and the regulating winding is connected between the load 125 and a neutral point unconnected to the load. In some embodiments, the series winding of the autotransformer 115 is designed for very high current. In some other embodiments, the series winding of the autotransformer 115 is designed for a very low number of turns. In some further embodiments, the series winding of the autotransformer 115 is designed for both very high current and very low number of turns.

The regulating winding of the autotransformer 115 contains a series of taps, which may be selected to enable a desired adjustment or regulation of the incoming voltage from the utility power supply 120. When the regulating winding is energized, the autotransformer 115 produces a voltage reduction proportional to the respective turns ratio of the series winding and the regulating winding.

As will be discussed in detail below, the autotransformer 115 includes a normally closed contactor incorporated directly in the power circuit of the autotransformer 115. Normally closed contactors as opposed to electronic switches may increase efficiency of the voltage regulation system since the copper losses through the contactors is much lower than the electronic switches.

Furthermore, incorporating the normally closed contactor in the power circuit of the autotransformer 115 directly, instead of using a normally closed contactor to drive a coil for closing a contact in the power circuit of the autotransformer 115, may result in superior reliability and a known state of the autotransformer 115 at any given point in time, including during initial application of power, removal of power, power failure or control failure.

Using a normally closed contactor to drive a coil for closing one or more contacts in the power circuit of the autotransformer 115 may result in a timeframe during the initial application of power in which the power circuit of the autotransformer 115 is in an unknown or undesirable state. Sometimes, the contacts in the power circuit of the autotransformer 115 may bounce prior to settling into a closed condition. In such cases, the use of a normally closed contactor to drive a coil for closing contacts in the power circuit of the autotransformer 115 can be especially problematic and damaging.

As illustrated in FIG. 1, controller 110 is coupled to the autotransformer 115 to control the configuration of the autotransformer 115. Controller 110 monitors the voltage at the input of the voltage regulator 105 from the utility power supply 120 to identify overvoltage situations. Controller 110 also determines the optimal voltage for the load 125 as well as the acceptable voltage levels at the load 125. Based on the desired voltage and taking into account acceptable voltage levels at the load 125, controller 120 generates control signals 130 to control the power circuit of the autotransformer 115, including various switches and contactors in the controller 110, in order to configure the autotransformer 115.

In the various embodiments illustrated herein, the voltage regulator 105 is capable of operating in two distinct modes. In one mode, the voltage regulator 105 operates in a zero voltage reduction mode. In the other mode, the voltage regulator 105 operates in an autotransformer mode or voltage reduction mode. In various embodiments, the voltage regulator 105 operates in the autotransformer mode to provide a voltage reduction of between 2%-10%.

The voltage reduction of between 2%-10% is provided here as an example only. A different range of voltage reduction, such as between 2%-12% or 2%-15%, or any other range, may also be possible by the voltage regulator 105 while operating in the autotransformer mode.

In the zero voltage regulation mode of operation, the voltage regulator 105 is configured so that the load 125 receives the incoming voltage from the utility power supply 120 without modification. In this mode of operation, two of the regulating winding taps of the autotransformer 115 are shorted together for each phase. This results in the autotransformer 115 functionally acting as a current transducer, whereby the current in the series winding produces a proportional current in the regulating windings, the magnitude of which is determined by the specific turns ratio of the shorted coils, and no change in voltage.

In the voltage reduction mode of operation, the voltage regulator 105 is connected between the load 125 and the utility power supply 120. In this mode of operation, the voltage regulator 105 completes an autotransformer type connection between the load side of the series winding and a point or tap on the regulating winding via one or more switches. The autotransformer connection with the tap on the regulating winding dictates the resulting voltage drop.

Figure 2A:
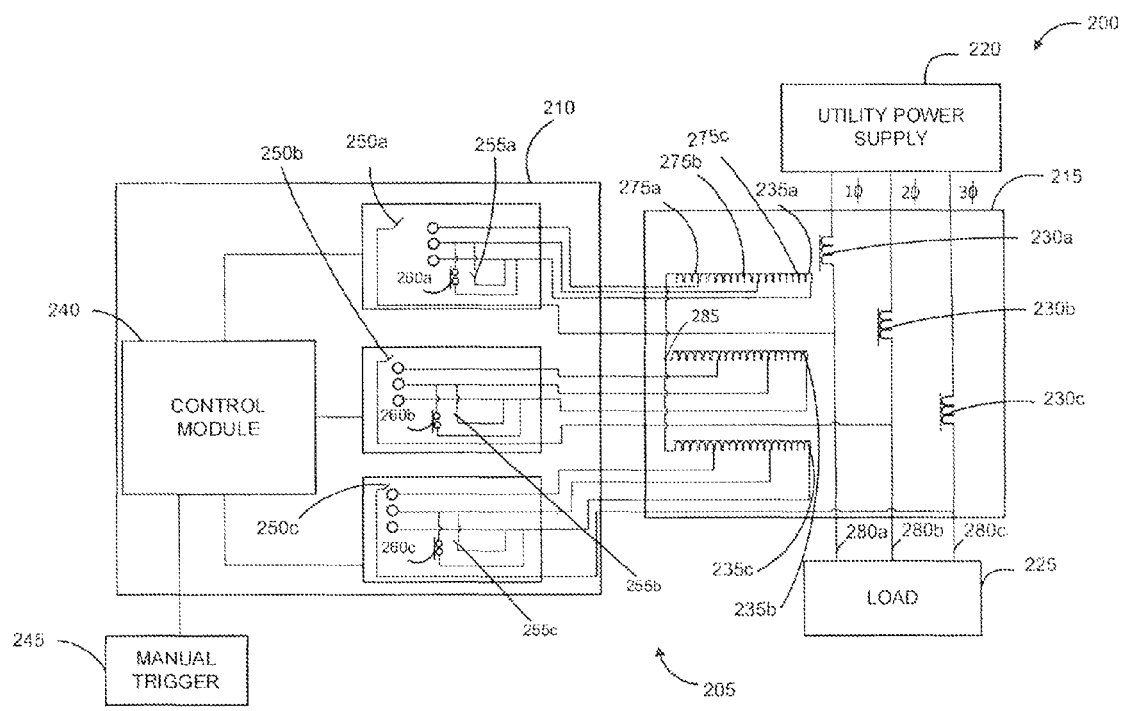
FIG. 2A illustrates a circuit diagram of a voltage regulation system according to an example embodiment.

Reference is next made to FIG. 2A, which illustrates a circuit diagram of a voltage regulation system 200 in accordance with an example embodiment. Voltage regulation system 200 is analogous to voltage regulation system 100 of FIG. 1. Voltage regulation system 200 includes a voltage regulator 205, a three phase utility power supply 220 and a three phase load 225. Voltage regulator 205 includes an autotransformer 215 and a controller 210 coupled to the autotransformer 215.

Autotransformer 215 is analogous to autotransformer 115 of FIG. 1, and includes series windings 230*a*, 230*b*, 230*c* connected between the three phase utility power supply 220 and outputs 280*a*, 280*b*, 280*c* to the three phase load 225. Autotransformer 215 further includes regulating windings 235*a*, 235*b*, 235*c* and each regulating winding includes three taps 275*a*, 275*b*, 275*c* (only labeled for winding 235*a*). In some other embodiments, more or less than three taps per regulating winding may be used.

Even though in the various embodiments illustrated herein, each regulating winding is shown to include only three taps, the teachings and the advantages disclosed herein are also applicable to an autotransformer including regulating windings with more or less than three taps each.

Each tap (such as taps 275*a*, 275*b*, 275*c* of regulating winding 235*a*) represents an effective voltage drop. In some embodiments, taps 275*a*, 275*b*, 275*c* of regulating winding 235*a* and corresponding taps of regulating windings 235*b* and 235*c* represent a voltage drop of 2%, 4% and 6%, respectively.

As illustrated, one end of the regulating winding of each phase 235*a*, 235*b*, 235*c* connects together to form a wye connection ("Y") with an isolated neutral point 285. The regulating windings of each phase 235*a*, 235*b*, 235*c* have further connections extending out of the one or more taps to tap selection switches 250*a*, 250*b*, 250*c* of the controller 210.

Controller 210 is analogous to controller 110 of FIG. 1. Controller 210 includes switches and contactors to control the configuration of the autotransformer 215. As illustrated, controller 210 includes a control module 240, tap selection switches 250*a*, 250*b*, 250*c*, zero voltage reduction mode switches 255*a*, 255*b*, 255*c* and normally closed contactors 260*a*, 260*b*, 260*c*. In the various embodiments illustrated herein, the various switches in the controller 210 are independently controlled switches. Preferably, the tap selection switches 250*a*, 250*b*, 250*c* and the zero voltage reduction mode switches 255*a*, 255*b*, 255*c* are electronically controlled power semiconductors.

Tap selection switches 250*a*, 250*b*, 250*c* are a set or multiple sets of switches connectable from the load side of the series winding 230*a*, 230*b*, 230*c* to the taps 275*a*, 275*b*, 275*c* on the regulating winding 235*a*, 235*b*, 235*c*. In operation, each tap selection switch 250*a*, 250*b*, 250*c* connects the load side of the series winding 230*a*, 230*b*, 230*c* of the corresponding phase to one of the plurality of taps 275*a*, 275*b*, 275*c* on the regulating winding 235*a*, 235*b*, 235*c* of the corresponding phase. When closed, the tap on the regulating winding 235*a*, 235*b*, 235*c* to which the corresponding tap selection switch 250*a*, 250*b*, 250*c* is connected determines the resultant voltage reduction on the load side of the series winding 230*a*, 230*b*, 230*c* and therefore the voltage to the load 225, relative to the utility power supply 220. In other words, the voltage reduction is dependent on the ratio of the number of turns of the respective regulating windings 235*a*, 235*b*, 235*c* connected in each phase. As previously mentioned, in the various embodiments illustrated herein, taps 275*a*, 275*b*, 275*c* represent an effective voltage drop of 2%, 4% and 6% respectively. When open, the tap selection switches 250*a*, 250*b*, 250*c* isolate the series windings 230*a*, 230*b*, 230*c* of the autotransformer 215 from the regulating winding 235*a*, 235*b*, 235*c*.

Zero voltage reduction mode switches 255*a*, 255*b*, 255*c* are a set of switches connected to provide a current path across two of the regulating winding taps of each phase respectively. For example, a zero voltage reduction mode switch 255*a* is connected between taps 275*b* and 275*c* of the regulating winding 235*a* to provide a current path across the taps 275*b* and 275*c*. When closed, the zero voltage reduction mode switches 255*a*, 255*b*, 255*c* result in the regulating winding 235*a*, 235*b*, 235*c* producing a current that is proportional to the load current and dependent on the respective turns ratio of the shorted regulating winding 235*a*, 235*b*, 235*c* and the series winding 230*a*, 230*b*, 230*c*. In this configuration, the autotransformer 215 enables a local current path across a portion of the regulating winding 235*a*, 235*b*, 235*c* to prevent saturation of the autotransformer core when none of the taps are selected, and accordingly, results in a current transformer in operation and zero voltage reduction to the load.

Normally closed contactors 260*a*, 260*b*, 260*c* are a set of switches connected across two or more taps of regulating windings of each phase to provide a current path across the respective regulating winding taps.

In various embodiments described herein, the normally closed contactors 260*a*, 260*b*, 260*c* are connected in parallel to zero voltage reduction mode switches 255*a*, 255*b*, 255*c* of the corresponding phase to provide a current path across two or more of the regulating winding taps of each phase respectively. For example, a normally closed contactor 260*a* is connected in parallel to zero voltage reduction mode switch 255*a* and between taps 275*b* and 275*c* of the regulating winding 235*a* to provide a current path across the taps 275*b* and 275*c*. In some other embodiments, the normally closed contactors 260*a*, 260*b*, 260*c* are connected in different configurations with respect to the zero voltage reduction mode switches 255*a*, 255*b*. 255*c* of the corresponding phase to provide a current path across two or more taps of the regulating winding of the corresponding phase.

Even though the various embodiments discussed herein illustrate the normally closed contactors connected in parallel with the zero voltage reduction mode switches, the teachings and the advantages disclosed herein are also applicable to any controller 210 having the normally closed contactors connected across one subset of at least two taps of each regulating winding, and the zero voltage reduction mode switches connected across another subset of at least two taps of the corresponding regulating windings.

Normally closed contactors 260a, 260b, 260c are closed via mechanical arrangement of their coil and spring in the absence of power to the corresponding coils connected by the respective normally closed contactors 260a, 260b, 260c. The contacts of the normally closed contactors 260a, 260b, 260c are opened by providing power to the respective coils.

In the various embodiments illustrated herein, the tap selection switches 250a, 250b, 250c and the zero voltage reduction mode switches 255a, 255b, 255c are electronic switches. In some other embodiments, the tap selection switches 250a, 250b, 250c and the zero voltage reduction mode switches 255a, 255b, 255c may be mechanical or electro-mechanical switches.

In cases where the tap selection switches 250a, 250b, 250c and the zero voltage reduction mode switches 255a, 255b, 255c are electronic switches, these switches may be semiconductor based AC switches, such as silicon controlled rectifiers. For example, each of the tap selection switches 250a, 250b, 250c and the zero voltage reduction mode switches 255a, 255b, 255c may be a pair of silicon controlled rectifiers (SCRs) connected in an anti-parallel fashion with a common gate drive to allow for AC switching. An SCR is held on by the application of voltage to the gate and turned off once the gate signal is removed and the current reverses polarity or commutates.

In various embodiments, a normally closed contactor 260a, 260b, 260c is a normally closed single pole single throw electromechanical relay. In such embodiments, the contact is held closed, in the absence of power, by a mechanical spring and an electromagnetic coil opens the contact when the coil is energized.

Control module 240 of controller 210 controls the configuration of the autotransformer 215 by controlling the operation of tap selection switches 250a, 250b, 250c, zero voltage reduction mode switches 255a, 255b, 255c and normally closed contactors 260a, 260b, 260c. In various embodiments, control module 240 controls the configuration of the autotransformer 215 by monitoring the voltage at the output of the utility power supply 220 or of the load to identify overvoltage situations. Optionally, the control module 240 monitors the voltage at the load and computes the voltage at the output of the utility power supply 220 based on the regulating winding tap connections. Control module 240 also determines the optimal voltage for the load 225 as well as the acceptable voltage levels at the load 225. Based on the desired voltage and taking into account acceptable voltage levels at the load 225, control module 240 generates control signals to operate various switches and contactors in the controller 210 in order to configure the autotransformer 215.

In some embodiments, controller 210 includes a manual trigger 245 coupled to the control module 240. In such embodiments, the manual trigger 245 is used to actuate the zero voltage reduction mode switches 255a, 255b, 255c to provide a current path across the taps of the regulating windings 235a, 235b, 235c.

Figure 2B:
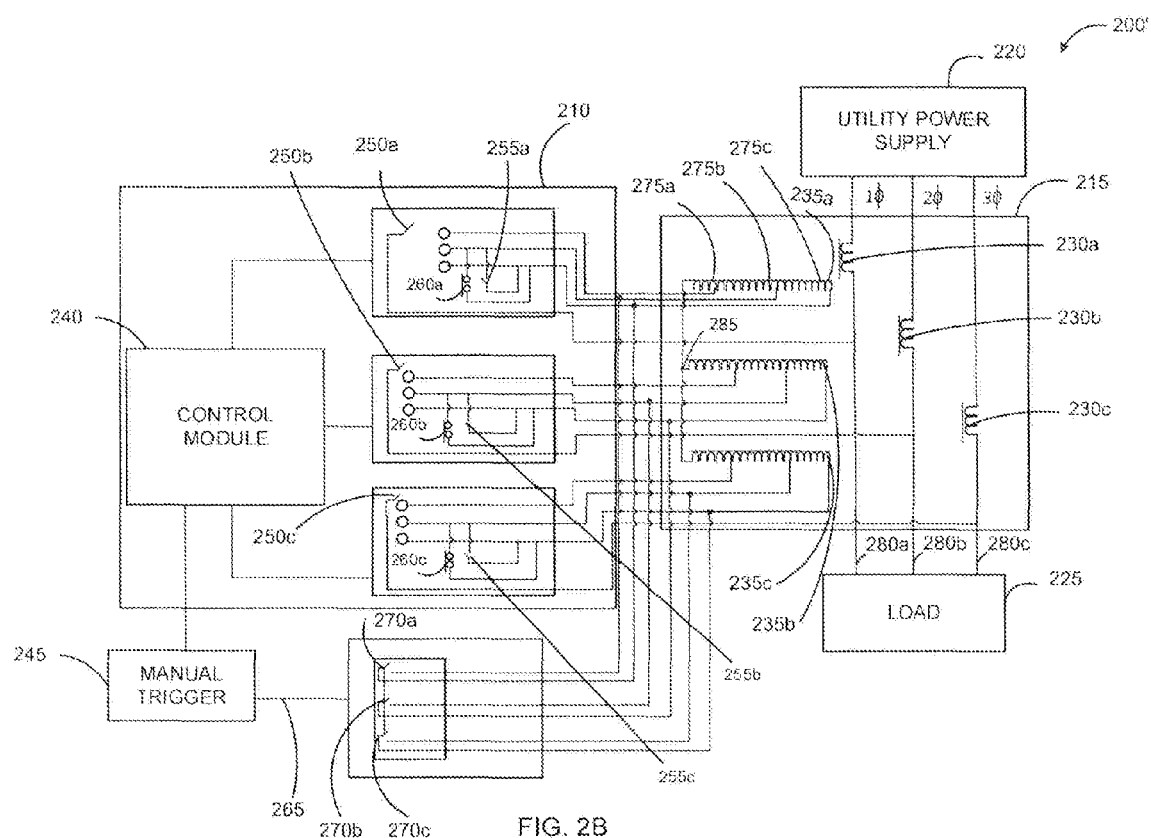
FIG. 2B illustrates a circuit diagram of a voltage regulation system according to another example embodiment.

Reference is briefly made to FIG. 2B, which illustrates a circuit diagram of a voltage regulation system 200' in accordance with an example embodiment. Voltage regulation system 200' is analogous to voltage regulation system 200 of FIG. 2A, with the exception of auxiliary zero voltage reduction mode switches 270a, 270b, 270c coupled between the manual trigger 245 and regulating windings of the autotransformer 215.

Auxiliary bypass switches 270a, 270b, 270c illustrated in this embodiment are mechanical switches and provide another mechanism to provide a current path across the taps of the regulating windings 235a, 235b, 235c. The auxiliary bypass switches 270a, 270b, may be manually or electronically activated. Where electronic actuation of the mechanical switches is desired, such actuation may be triggered by the manual trigger 245. In this process, the manual trigger 245 compels the control module 240 to first engage the bypass switches 255a, 255b, 255c, and then close auxiliary bypass switches 270a, 270b, 270c via control line 265.

In some embodiments, a separate control module, analogous to control module 240, may be provided in order to segregate the mechanical switch control function of the auxiliary bypass switches 270a, 270b, 270c from the electronic switch control function of bypass switches 255a, 255b, 255c.

Optionally, in both the embodiments of FIGS. 2A and 2B, a separate control module, analogous to control module 240, may be used to segregate the tap selection functionality from the short circuiting functionality. In such cases, one control module is used to control the operation of tap selection switches 250a, 250b, 250c, and a different control module is used to control the operation of zero voltage reduction mode switches 255a, 255b, 255c, normally closed contactors 260a, 260b, 260c and auxiliary bypass switches 270a, 270b, 270c, where applicable.

The autotransformer 215 of the voltage regulation systems 200 and 200' are operated in two modes by controller 210: a zero voltage reduction mode and an autotransformer mode. In the zero voltage reduction mode of operation, two taps of each of the regulating windings of each phase are shorted together. This connection can be provided by one or more of the zero voltage reduction mode switches 270a, 270b, 270c, normally closed contactors 260a, 260b, 260c and auxiliary bypass switches 270a, 270b, 270c. In this configuration, the current flows directly from the utility power supply 220 through the series windings 230a, 230b, 230c to the target load 225 and the regulating windings 235a, 235b, 235c are isolated from the series winding 230a, 230b, 230c. The short circuit connection across the regulating winding 235a, 235b, 235c results in no voltage across the regulating winding 235a, 235b, 235c. In this configuration, the autotransformer 215 has no voltage drop across the series winding 230a, 230b, 230c from the magnetic action of the autotransformer 215, which results in a proportion current generated in the regulating winding 235a, 235b, 235c, the value of which is determined by the respective tap ratios of the series winding 230a, 230b, 230c and the portion of the regulating winding 235a, 235b, 235c that is shorted.

In the autotransformer mode of operation, a connection is provided between one of the taps 275a, 275b, 275c of the regulating winding 235a, 235b, 235c and the load side of the series winding 230a, 230b, 230c. With this connection in place, the current flows from the utility power supply 220 through the series winding 230a, 230b, 230c to the target load 225. However, a portion of this current flows through the regulating winding 235a, 235b, 235c since the autotransformer connection is present.

In this mode of operation, the polarities of the respective windings 235a, 235b, 235c are configured so that the magnetic action of the autotransformer 215 produces a voltage drop across the series winding 230a, 230b, 230c, effectively reducing the voltage supplied to the load 225. The voltage drop is dependent on the number of turns of the series winding 230a, 230b, 230c and connected portion of the regulating winding 235a, 235b, 235c. In this mode of operation, the zero voltage reduction mode switches 255a, 255b, 255c as well as the normally closed contactors 260a, 260b, 260c must remain open at all times. In embodiments including auxiliary bypass switches 270a, 270b, 270c, the auxiliary bypass switches 270a, 270b, 270c also must remain open at all times in this mode of operation.

Figure 3A:
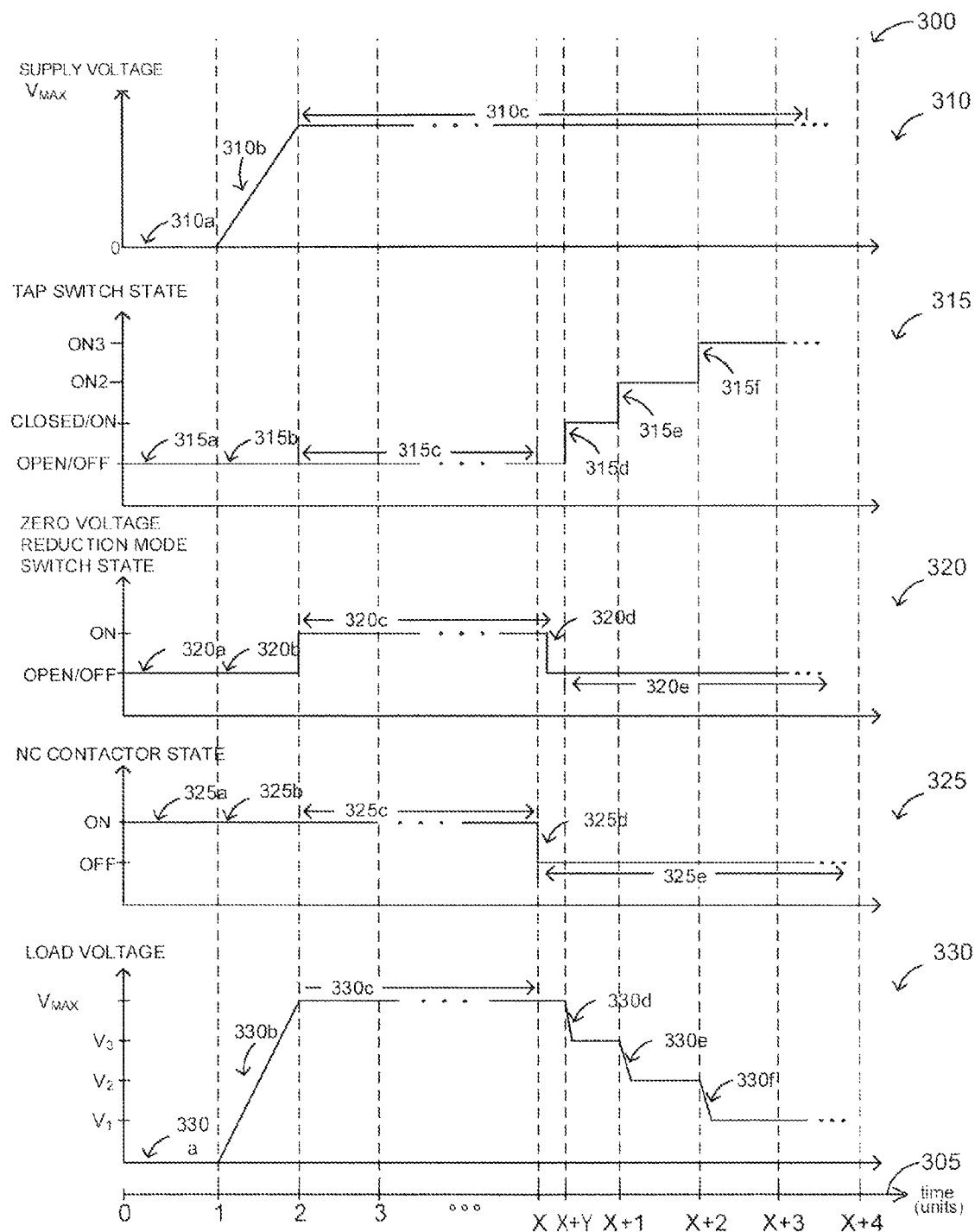
FIG. 3A illustrates a graphical representation of operation of various components of a voltage regulation system according to an example embodiment.

Reference is next made to FIG. 3A, which illustrates a graphical representation 300 of the operation of various components of a voltage regulation system in accordance with an example embodiment. The voltage regulation system of this embodiment may be analogous to any one of the voltage regulation system 100 of FIG. 1, the voltage regulation system 200 of FIG. 2A and the voltage regulation system 200' of FIG. 2B.

FIG. 3A illustrates the operation of the various components of a voltage regulation system over a duration of time illustrated by timeline 305. The various components, the operations of which are illustrated by FIG. 3A, include utility power supply, tap selection switch, zero voltage reduction mode switch, normally closed contactor and load. The tap selection switch, the zero voltage reduction mode switch and the normally closed contactor operations illustrated herein relate to a single phase operation of these components in the three phase voltage regulation system. The operations of the tap selection switches, zero voltage reduction mode switches and the normally closed contactors for the other phases are analogous to the operations illustrated herein.

As a matter of convenience, the operation of a voltage regulation system illustrated in FIG. 3A is illustrated with reference to the voltage regulation system 200 of FIG. 2A, and particularly with reference to only one of the three phases of the voltage regulation system 200. Any other voltage regulation system analogous to the voltage regulation system 200 of FIG. 2A, such as the voltage regulation system 100 of FIG. 1 and voltage regulation system 200' of FIG. 2B, as well as any other phase of the voltage regulation system 200 may operate in a similar manner.

FIG. 3A illustrates a graphical representation 310 of the operation of a utility power supply, analogous to the utility power supply 220 of FIG. 2A, a graphical representation 315 of a single phase tap selection switch, analogous to tap selection switch 250a of FIG. 2A, a graphical representation 320 of a zero voltage reduction mode switch, analogous to bypass switch 255a of FIG. 2A, a graphical representation 325 of a normally closed contactor, analogous to normally closed contactor 260a of FIG. 2, and a graphical representation 330 of load, analogous to load 225 of FIG. 2.

As illustrated in FIG. 3A, time t=0 to t=1 of timeline 305 represents the power off mode of the voltage regulation system, where the incoming voltage from the utility power supply 220 is 0 Volts, as illustrated by pointer 310a in graph 310. Since in this mode the utility power supply 220 is off and not providing any power to the voltage regulation system 200, the tap selection switch 250a and the zero voltage reduction mode switch 255a, assumed to be electronic switches, are off as well. As illustrated by pointer 315a of graph 315 and pointer 320a of graph 320, in this mode, the tap selection switch 250a and the zero voltage reduction mode switch 255a, respectively, are in "off" state.

However, in this mode, the normally closed contactor 260a is closed via mechanical force exerted by the spring used in the design of a normally closed contactor. This state of the normally closed contactor 260a is illustrated by pointer 325a of graph 325. In this configuration, the normally closed contactor 260a wired to each phase provides a current path across the regulating winding 235a prior to the application of power from the utility power supply 220. In this time between time t=0 to t=1, as well at the instant of start-up, all of the control mechanisms of the controller 210 are in an unpowered and inactive state. This continues until power is applied and the various hardware and software components of the controller 210 generally, and of the control module 240 particularly, can be powered on. In the power off mode, the voltage at the load is 0 volts, as illustrated by pointer 330a of graph 330.

Next, time t=1 to t=2 of timeline 305 of FIG. 3A represents the startup mode of the voltage regulation system, where power is beginning to be applied via the utility power supply 220. This is illustrated by power increase 310b from 0 volts to $V_{max}$ in graph 310. For ease of illustration, voltage $V_{max}$ represents the nominal voltage value of the AC voltage supply from the utility power supply 220 for a single phase.

When power is applied via the utility power supply 220, the series winding 230a, 230b or 230c does not show a voltage drop and the incoming voltage from the utility power supply 220 is supplied directly to the load 225 without reduction. The graph 330 illustrates that the load voltage follows the supply voltage, as illustrated by pointer 330b of graph 330.

Also in this mode, the tap selection switch 250a and the zero voltage reduction mode switch 255a continue to be in "off" or open state, as illustrated by pointer 315b of graph 315 and pointer 320b of graph 320, respectively. Furthermore, in this mode, the normally closed contactor 260a continues to be in "on" or closed state, as illustrated by pointer 325b of graph 325, ensuring the transformer is in a controlled and known state.

Furthermore in this mode, the controller 210, specifically the control module 240, starts up and completes a self-check process. When control is established, the system transitions to a powered on zero voltage reduction state. This is a very rapid process. However, without the normally closed contactor 260a, the autotransformer 215 and the associated circuitry may be subjected to potentially damaging extreme voltages until control is established.

Next, time t=2 to t='x' of timeline 305 of FIG. 3A represents the zero voltage reduction mode of the voltage regulation system where the incoming voltage from the utility power supply 220 is stabilized at $V_{max}$, as illustrated by pointer 310c of graph 310. Once in this state, where the control has been established, the zero voltage reduction mode switch 255a in parallel with the normally closed contactor 260a is closed, as illustrated by pointer 320c of graph 320. An advantage of switching the state of the zero voltage reduction mode switch 255a from "open" to "closed" may include minimizing the stress on the normally closed contactor 260a, when switched later in the process.

Furthermore, in this time, i.e. time t=2 to t='x' of timeline 305, the normally closed contactor 260a continues to be "on", as illustrated by pointer 325c of graph 325, and the tap selection switch 250a continues to be "off", as illustrated by pointer 315c of graph 315. Furthermore, in this mode, the load voltage continues to follow the supply voltage, as illustrated by pointer 330c of graph 330. For each of illustration, the load voltage is also illustrated as the nominal voltage value of the AC voltage received at the load for a single phase.

Next, time t='x' to t='x+y' of timeline 305 of FIG. 3A illustrates the transition from the zero voltage reduction mode to the autotransformer mode. The transition is initiated by controller 210 to provide a voltage reduction to the load 225 as a response to either the electrical conditions measured in an automatic mode or to a user input request. Before the transition from the zero voltage reduction mode to the autotransformer mode can be carried out, the voltage regulation system, and particularly the controller 210, ensures that the input conditions are appropriate to facilitate the transition. In some embodiments, ensuring that the input conditions are appropriate may involve carrying out certain checks, such as system status checks, system input voltage checks, etc. For example, if sufficient input voltage is not present, the voltage regulation system may not initiate a transition. However, if the system passes the pre-transition checks, a transition may be initiated.

In this transition mode, between time t='x' to t='x+y', the utility power supply 220 voltage continues to be at $V_{max}$, as illustrated by pointer 310c of FIG. 310. At time t='x', the normally closed contactor 260a is opened, as illustrated by pointer 325d of graph 325. This is accomplished by providing power to the respective coils connected by the normally closed contactor 260a. Since the zero voltage reduction mode switch 255a, which is in parallel to the normally closed contactor 260a, has been previously closed, the voltage stress across the normally closed contactor 260a is greatly minimized during the transition.

Once the coils connected by the normally closed contactor 260a are powered and the contactor 260a has been allowed to settle, the controller 210 opens the zero voltage reduction mode switch 255a. This is illustrated at pointer 320d of graph 320.

Shortly thereafter, at time t='x+y', the controller 210 immediately closes the tap selection switch 250a associated with the smallest voltage reduction setting corresponding to tap 275a. This is illustrated by pointer 315d of graph 315, where the state of the tap selection switch changes from "open" to "closed1," corresponding to the smallest voltage reduction setting.

As a result of the closing of the tap selection switch 250a, a voltage reduction across the series winding 230a is resulted. This is due to the magnetic operation established by the connection of the regulating winding 235a to the series winding 230a. Consequently, the voltage at the load 225 decreases from $V_{max}$ to $V_3$, as illustrated by pointer 330d of graph 330, where $V_3$ is the resultant voltage at the load after the smallest voltage reduction to the utility power supply voltage.

Next, time t='x+1' of timeline 305 of FIG. 3A represents the time when the tap selection switch 250a connection is changed from the smallest voltage reduction setting to the intermediate voltage reduction setting corresponding to tap 275b. At this time, the zero voltage reduction mode switch 255a continues to be opened, as illustrated by pointer 320e of graph 320, and the normally closed contactor 260a continues to be opened, as illustrated by pointer 325e of graph 325. In response, the voltage at the load 225 decreases from $V_3$ to $V_2$, as illustrated by pointer 330e of graph 330, where $V_2$ is the resultant voltage at the load after the intermediate voltage reduction to the utility power supply voltage.

Next, time t='x+2' of timeline 305 of FIG. 3A represents the time when the tap selection switch 250a connection is changed from the intermediate voltage reduction setting to the largest voltage reduction setting corresponding to tap 275c. In response, the voltage at the load 225 decreases from $V_2$ to $V_1$, as illustrated by pointer 330f of graph 330, where $V_1$ is the resultant voltage at the load after the largest voltage reduction to the utility power supply voltage.

Figure 3B:
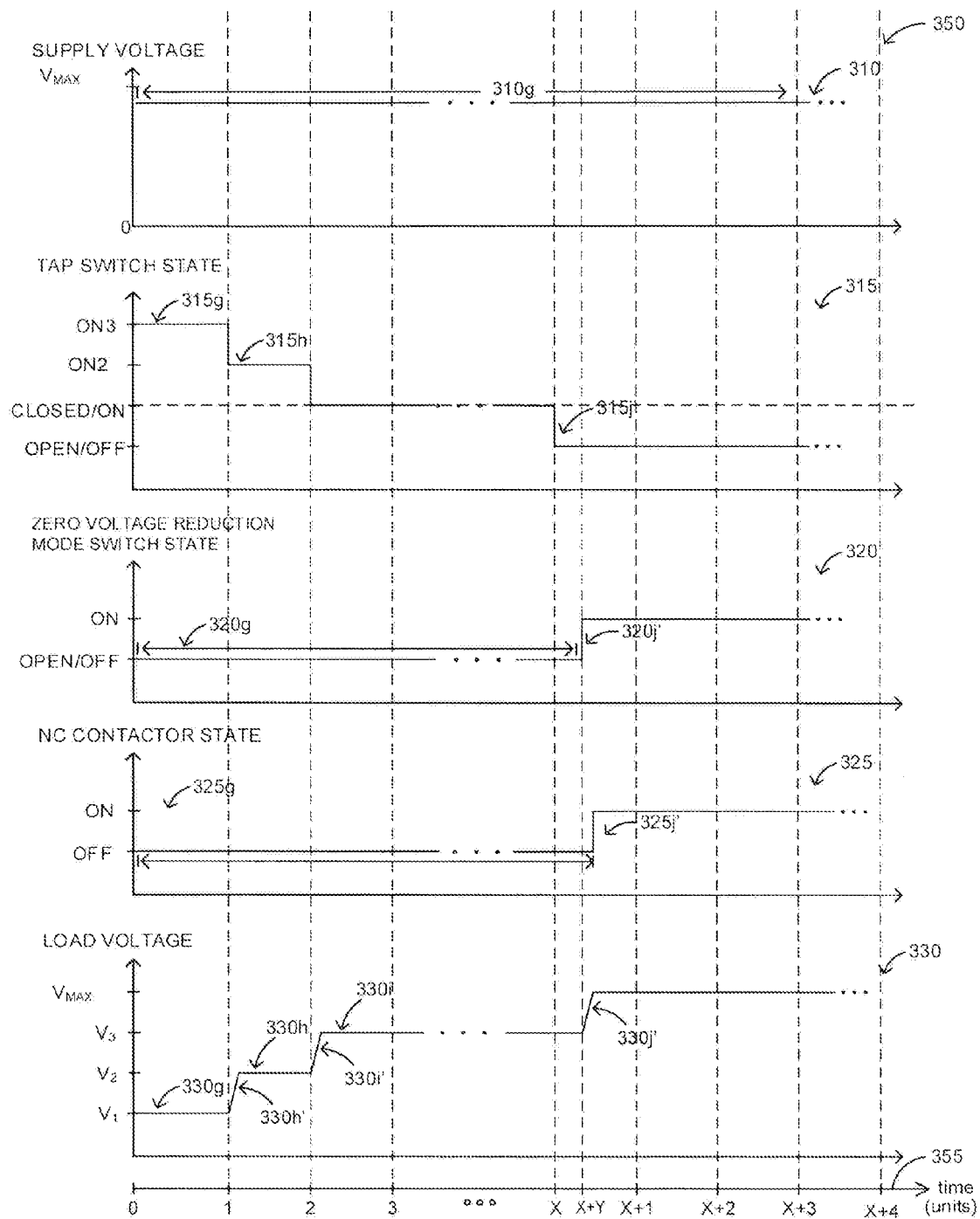
FIG. 3B illustrates a graphical representation of operation of various components of a voltage regulation system according to another example embodiment.

Reference is next made to FIG. 3B, which illustrates the operation 350 of the various components of a voltage regulation system in accordance with another example embodiment. In this embodiment, the operation of the various components of a voltage regulation system is illustrated over a duration of time represented by timeline 355. FIG. 3B generally discloses the transition of the voltage regulation system from the autotransformer mode to the zero voltage reduction mode.

In the embodiment of FIG. 3B, the transition of the voltage regulation system from the autotransformer mode to the zero voltage reduction mode is made with the use of the smallest voltage reduction mode available on the system. This may have the advantage of minimizing stress on the autotransformer core and preventing excessive current transients associated with temporarily driving the transformer core into saturation. Accordingly, FIG. 3B also illustrates the transition of the voltage regulation system from the largest voltage reduction mode to the smallest voltage reduction mode to facilitate the transition of the voltage regulation system from the autotransformer mode to the zero voltage reduction mode.

Similar to FIG. 3A, FIG. 3B illustrates a graphical representation 310 of the operation of a utility power supply, analogous to the utility power supply 220 of FIG. 2, a graphical representation 315 of a single phase tap selection switch, analogous to tap selection switch 250a of FIG. 2, a graphical representation 320 of a zero voltage reduction mode switch, analogous to zero voltage reduction mode switch 255a of FIG. 2, a graphical representation 325 of a normally closed contactor, analogous to normally closed contactor 260a of FIG. 2, and a graphical representation 330 of load, analogous to load 225 of FIG. 2.

As a matter of convenience, the operation of a voltage regulation system illustrated in FIG. 3B is illustrated with reference to the voltage regulation system 200 of FIG. 2A, and particularly with reference to only one of the three phases of the voltage regulation system 200. Any other voltage regulation system analogous to the voltage regulation system 200 of FIG. 2A, as well as any other phase of the voltage regulation system 200 may operate in a similar manner.

As illustrated in FIG. 3B, time t=0 to t=1 of timeline 335 represents the mode of operation where the incoming voltage from the utility power supply 220 is $V_{max}$, as illustrated by pointer 310g in graph 310, and tap selection switch 250a is at the largest voltage reduction level 315g, as illustrated in graph 315. In this time, the zero voltage reduction mode switch 255a and the normally closed contactor 260a are both open, as illustrated by pointers 320g of graph 320 and 325g of graph 325, respectively. In time t=0 to t=1 of timeline 335, the voltage at the load 225 is at $V_1$, which is resultant voltage at the load 225 after the largest voltage reduction of the incoming voltage from the utility power supply 220. This is illustrated by reference 330g in graph 330.

Next, time t=1 to t=2 of timeline 335 represents the mode of operation where the tap selection switch 250a changes its state from the largest voltage reduction level 315g to intermediate voltage reduction level 315h, as illustrated in graph 315. In response, where the voltage of the utility power supply 220 continues to be at $V_{max}$, as illustrated by pointer 310g of graph 310, and the zero voltage reduction mode switch 255a and the normally closed contactor 260 continue to be "open", as illustrated by pointers 320g of graph 320 and 325g of graph 325, respectively, the voltage at the load increases from $V_1$ to $V_2$, as illustrated by pointer 330h'. The load voltage then stabilizes at $V_2$ until further change, as illustrated by pointer 330h of graph 330.

Between time t=2 to t=3 of timeline 335, the tap selection switch 250a changes its state from the intermediate voltage reduction level 315h to smallest voltage reduction level 315i, as illustrated in graph 315. In response, with all other conditions being same as between time t=1 to t=2, the voltage at the load increases from $V_2$ to $V_3$, as illustrated by pointer 330i'. The load voltage then stabilizes at $V_3$, as illustrated by pointer 330i of graph 330.

In the various embodiments illustrated herein, the change of tap operation or change in the settings of the tap selection switch is completed on a phase by phase basis. In various cases, a short gap of time (such as, for example, a gap of approximately 500 msec) occurs between the tap change operation of each phase.

Also in various embodiments, the operation of the tap selection switches 250a, 250b, 250c is synchronized with the voltage at the respective phase. For example, in some embodiments, the operation of the tap selection switch 250a, 250b or 250c is synchronized with the zero cross of the AC waveform corresponding to the respective phase's voltage. In this type of synchronization, a tap selection switch 250a, 250b or 250c is opened just prior to the zero cross, and the new tap selection switch 250a, 250b or 250c is closed just after the zero cross. Once the tap selection switch is closed, the autotransformer 215 provides the new voltage reduction. In some other embodiments, the operation of the tap selection switches 250a, 250b, 250c is synchronized with another time on the AC waveform corresponding to the respective phase's voltage. Such other time may include peak, midpoint etc. of the AC waveform corresponding to the respective phase's voltage.

In such embodiments, the process of increasing or decreasing the voltage reduction provided by the voltage regulation system is similar to each other, with the transition occurring on a phase by phase basis, and synchronized to either the AC voltage zero cross, or some other time on the voltage waveform.

In some further embodiments, the operation of the tap selection switches 250a, 250b, 250c is synchronized with respect to the current waveform for each phase. For example, the tap selection switches 250a, 250b, 250c may be synchronized based on the zero cross points on the current waveforms of each phase. The tap selection switches 250a, 250b, 250c may alternatively be synchronized based on peaks, mid-points or some other time on the current waveforms of each phase.

FIG. 3B further illustrates the transition of the voltage regulation system from autotransformer mode to zero voltage reduction mode, which is initiated at time t=x. At that time, when the controller 210 determines that the transition to zero voltage reduction mode is required, the tap selection switch 250a associated with the lowest voltage reduction setting 315i is opened, as illustrated by pointer 315j' of graph 315 at time t=x.

Immediately after the tap selection switch 250a is, opened, at time t='x+y', the zero voltage reduction mode switch 255a providing the zero voltage reduction mode connection to the regulating winding 235a is closed, as illustrated by pointer 320j' of graph 320. Accordingly, the voltage drop across the series winding 230a becomes zero.

Once the zero voltage reduction mode switch 255a is closed, power is removed from the coils of the normally closed contactor 260a allowing the normally closed contactor 260a to close via the mechanical arrangement of its coil and spring. This is illustrated by pointer 325j' of graph 325. In response, the voltage at the load 225 increases from $V_3$ to $V_{max}$, as illustrated by pointer 330j' of graph 330.

As illustrated in FIG. 3B, if the controller 210 determines that the voltage reduction should be increased in response to electrical conditions on the voltage regulation system or in response to user input, the controller 210 initiates a change of tap operation. While changing tap settings, such as at time t=1, t=2 and t=3 in graph 315, and at all times when operating in autotransformer mode, such as at time t=0 to t=x, the normally closed contactor 260a remains open, as illustrated by pointer 325g between time t=0 to t='x+y' in graph 325.

In order to prevent transformer core saturation, which is undesirable and may lead the damage in the controller and/or autotransformer, the two modes of operation of the voltage regulation system remain distinctly separate and not overlap in time. In order to accomplish a transition from one mode to the other, all switching components, such as contactor and switches (whether electronic, electromechanical or mechanical) remain open for a short duration of time when switching between the zero voltage reduction mode and the autotransformer mode.

Figure 4:
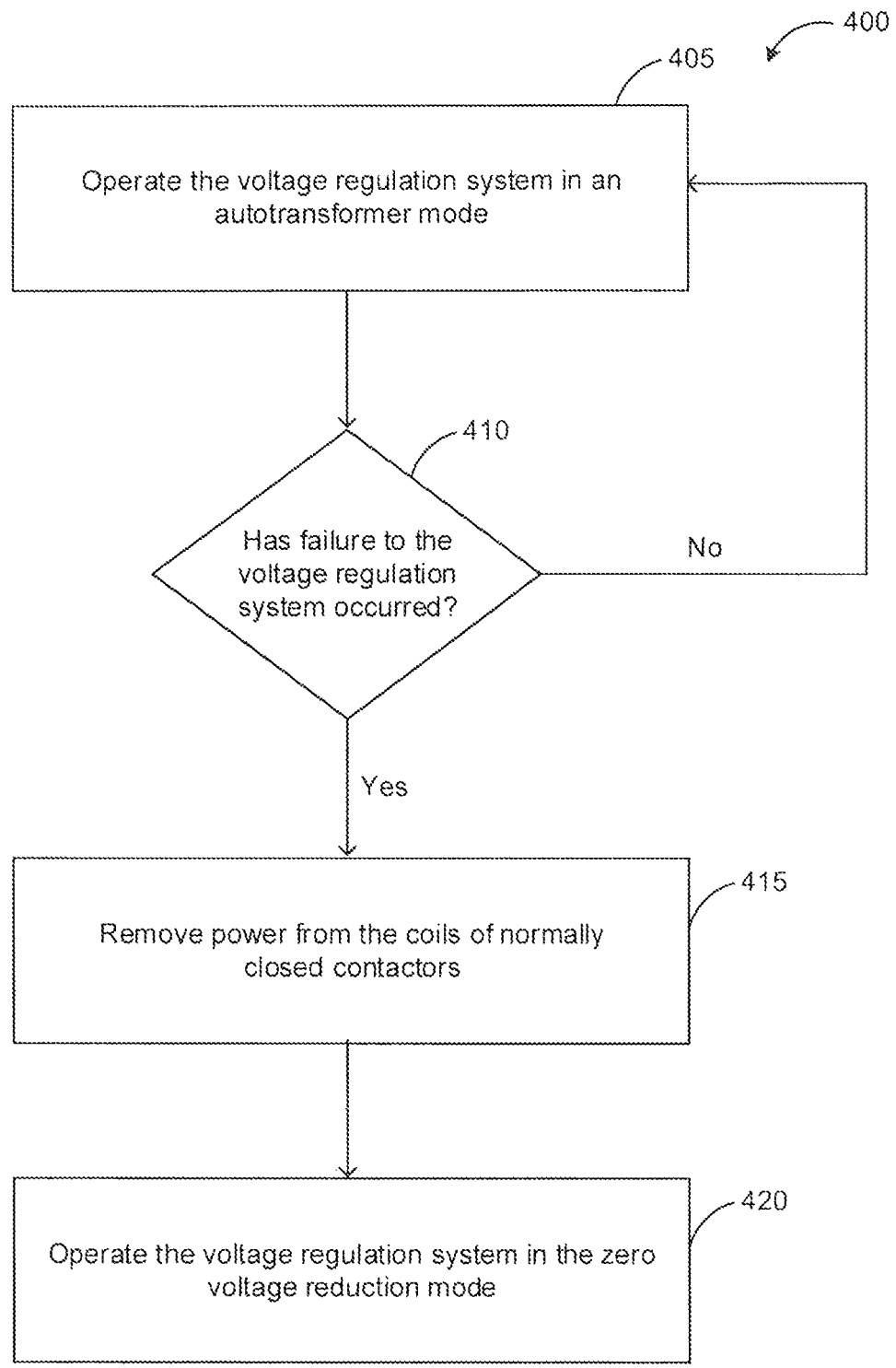
FIG. 4 illustrates a method for regulating incoming voltage from a utility power supply in accordance with an example embodiment.

Reference is next made to FIG. 4, which illustrates an example embodiment of a method 400 for regulating incoming voltage from a utility power supply in accordance with the teachings herein. The method 400 may be carried out by any voltage regulation system analogous to voltage regulation system 200 of FIG. 2A. The method 400 illustrates the operation of the voltage regulation system to regulate the incoming voltage in an event of a failure of the voltage regulation system.

At 405, the voltage regulation system is operating in an autotransformer mode. In the autotransformer mode, the voltage regulation system provides a voltage reduction to the incoming voltage from utility power supply 220 before supplying to a load 225. In some embodiments, the voltage regulation system provides a voltage reduction of between 2%-10% to the incoming voltage from the utility power supply 220.

At 410, it is determined if a failure to the voltage regulation system has occurred. In various embodiments, the control module 240 determines if a failure condition (for example, power failure, control failure etc.) associated with the voltage regulation system has been detected. In other embodiments, other ways of determining whether a failure to the voltage regulation system has occurred may be used.

The failure to the voltage regulation system may result from failure conditions at the utility power supply 220, load 225, or both. For example, a significant voltage sag on the incoming voltage supply may be considered to be a failure condition by the control module 240. Similarly, a significant event, such as a loss of a single phase of the incoming voltage or a complete power outage on the utility power supply side may be considered to be a failure condition by the control module 240.

In some other cases, the failure to the voltage regulation system may result from failure conditions arising from one or more components of the autotransformer 215 and/or controller 210. For example, failure or unexpected behavior of one or more of series windings 230a, 230b, 230c, regulating windings 235a, 235b, 235c, hardware and/or software associated with the control module 240 etc. may be considered to be a failure condition by the control module 240.

If power failure to the voltage regulation system is not determined to have occurred, the method continues at 405 where the voltage regulation system continues to operate in an autotransformer mode.

However, if power failure to the voltage regulation system is determined to have occurred, the method proceeds to 415, where the voltage regulation system responds by immediately removing power from the coils of the normally closed contactors 260a, 260b, 260c. In some cases, the removal of power from the coils is controlled, such as, for example, in response to a condition sensed by the control module 240. In other cases, the removal of power from the coils is uncontrolled, such as, for example, as a result of no output from the DC power supply that provides power to the control module 240 and power to the coils of the normally closed contactors 260a, 260b, 260c.

In various embodiments, at the same time as the removal of the power from the coils of the normally closed contactors 260a, 260b, 260c, the tap selection switches 250a, 250b, 250c are immediately opened, and the zero voltage reduction mode switches 255a, 255b, 255c are closed shortly after. The opening of the tap selection switches 250a, 250b, 250c and closing of the zero voltage reduction mode switches 255a, 255b, 255c occur in less than the mechanical actuation time of the normally closed contactors 260a, 260b, 260c, which greatly minimizes the stress on the normally closed contactors during this transition.

At 420, the voltage regulation system enters the zero voltage reduction mode. The transition to the zero voltage reduction mode occurs in the time between the power being removed from the coils of the normally closed contactors 260a, 260b, 260c and the time the contacts on the contactors are closed. In this mode, the autotransformer regulating windings 235a, 235b, 235c and the controller 210 are disconnected from the series windings 230a, 230b, 230c between the utility power supply 220 and the load 225, and the incoming voltage from the utility power supply 220 is provided directly to the load 225 without modification.

In the various embodiments illustrated herein, the zero voltage reduction mode of operation is the default mode of operation of the voltage regulation system regardless of the nature of the potential failure or shutdown. Using normally closed contactors in the circuitry of the autotransformer 215 to facilitate this transition may result in various advantages. Use of normally closed contactors may minimize stress on the electronic zero voltage reduction mode switching elements by sharing the current in the regulating windings, resulting from the zero voltage reduction mode of operation. In addition, the ability of the normally closed contactor to close in the absence of power may increase reliability of the voltage regulation system since the system will always be in a known state during power or control failure, as well as during start up, and in the absence of power.

The present invention has been described here by way of example only. Various modification and variations may be made to these exemplary embodiments without departing from the spirit and scope of the invention, which is limited only by the appended claims.

We claim:

1. A voltage regulator adapted to be electrically interposed between a utility power supply and a load, each having at least one phase, wherein the voltage regulator is configured to regulate the voltage supplied from the utility power supply to the load, the voltage regulator comprising:

an autotransformer having, for each phase, a series winding and a regulating winding, the regulating winding having a plurality of taps and the series winding having a load side for connection to the load and a supply side for connection to the utility power supply;

a controller coupled to the autotransformer, the controller configured to selectably operate the voltage regulator in at least a zero voltage reduction mode and an autotransformer mode;

the controller having a zero voltage reduction mode switch connected between a first subset of at least two of the plurality of taps of the regulating winding of each phase; and the controller having a normally closed contactor that is biased, in the absence of power to the normally closed contactor, to electrically couple a second subset of at least two of the plurality of taps of the regulating winding of each phase to provide an alternate current path to the zero voltage reduction mode switch.

2. The voltage regulator of claim 1, wherein, for each phase, the normally closed contactor is connected in parallel to the zero voltage reduction mode switch.

3. The voltage regulator of claim 2, wherein when power is applied to the normally closed contactor, the normally closed contactor electrically decouples the second subset of at least two taps.

4. The voltage regulator of claim 1, wherein, in the zero voltage reduction mode, each zero voltage reduction mode switch and each normally closed contactor provide a short circuit across the corresponding subsets of at least two taps of each regulating winding.

5. The voltage regulator of claim 1, wherein the controller comprises a plurality of tap selection switches, and wherein, for each phase, a tap selection switch is provided between the load side of the series winding and the plurality of taps of the regulating winding.

6. The voltage regulator of claim 5, wherein, in the autotransformer mode, each tap selection switch connects the load side of the series winding to one of the plurality of taps of the regulating winding, and the zero voltage reduction mode switch and the normally closed contactor are disconnected from the corresponding subsets of at least two taps of the regulating winding.

7. The voltage regulator of claim 5, wherein during transition from the zero voltage reduction mode to the autotransformer mode, each normally closed contactor is disconnected, each zero voltage reduction mode switch is opened, each tap selection switch is connected between the load side of the series winding and a smallest voltage reduction tap of the plurality of taps of the regulating winding, and the voltage at the utility power supply is reduced by an amount corresponding to the smallest voltage reduction tap before supplying to the load.

8. The voltage regulator of claim 5, wherein during transition from the autotransformer mode to the zero voltage reduction mode, each tap selection switch is disconnected from the smallest voltage reduction tap of the regulating winding, each zero voltage reduction mode switch is closed providing a current path across the two taps of each regulating winding, each normally closed contactor is connected to the two taps of each regulating winding, and the voltage at the utility power supply is supplied to the load without reduction.

9. The voltage regulator of claim 5, wherein if a failure condition is detected, each tap selection switch is opened, each zero voltage reduction mode switch is subsequently closed, and each normally closed contactor is connected to the second subset of at least two taps of each regulating winding to provide a current path across the corresponding taps.

10. The voltage regulator of claim 1, wherein at startup, the normally closed contactor provides a current path across the second subset of at least two taps of each regulating winding, the zero voltage reduction mode switch is open, and the voltage at the utility power supply is supplied to the load without reduction.

11. The voltage regulator of claim 1, further comprising an auxiliary zero voltage reduction mode switch connected between a third subset of at least two of the plurality of taps of each regulating winding, wherein,
the auxiliary zero voltage reduction mode switch, when closed, provides a current path across the third subset of at least two taps of each regulating winding.

12. A method of regulating voltage supplied from a utility power supply to a load, the method comprising:
selectably opening a normally closed contactor that is biased, in the absence of power to the normally closed contactor, to electrically couple a first subset of at least two taps of each regulating winding of an autotransformer, wherein the autotransformer comprises, for each phase, a series winding, a regulating winding and a plurality of taps on the regulating winding, wherein the autotransformer is selectably operable in at least a zero voltage reduction mode and an autotransformer mode by a controller coupled to the autotransformer, and wherein the autotransformer and the controller are electrically interposed between the utility power supply and the load, each having at least one phase.

13. The method of claim 12, wherein, for each phase, the normally closed contactor is connected in parallel to a zero voltage reduction mode switch.

14. The method of claim 12, wherein the autotransformer further comprises a zero voltage reduction mode switch connected between a second subset of at least two of the plurality of taps of the regulating winding of each phase, the method further comprising:
controlling each zero voltage reduction mode switch and each normally closed contactor to provide a current path across the second subset of at least two taps of each regulating winding in the zero voltage reduction mode.

15. The method of claim 14, wherein when power is applied to the normally closed contactor, the normally closed contactor electrically decouples the first subset of at least two taps.

16. The method of claim 12, further comprising:
selectably controlling a tap selection switch for each phase, wherein the tap selection switch is provided between a load side of a series winding and the plurality of taps of a regulating winding, wherein the series winding and the regulating winding correspond to the same phase.

17. The method of claim 16, further comprising:
in the autotransformer mode,
closing each tap selection switch to connect the load side of the series winding to one of the plurality of taps of the regulating winding; and
disconnecting the zero voltage reduction mode switch and the normally closed contactor from the corresponding subsets of at least two taps of the regulating winding.

18. The method of claim 16, further comprising:
during transition from the zero voltage reduction mode to the autotransformer mode,
disconnecting each normally closed contactor;
opening each zero voltage reduction mode switch; and
closing each tap selection switch to connect the load side of the series winding to a smallest voltage reduction tap of the plurality of taps of the regulating winding,
wherein, after the transition, the voltage at the utility power supply is reduced by an amount corresponding to the smallest voltage reduction tap before supplying to the load.

19. The method of claim 16, further comprising:
during transition from the autotransformer mode to the zero voltage reduction mode,
disconnecting each tap selection switch from the smallest voltage reduction tap of the regulating winding;
closing each zero voltage reduction mode switch to provide a current path across the second subset of at least two taps of each regulating winding; and
connecting each normally closed contactor to the first subset of at least two taps of each regulating winding,
wherein, after the transition, the voltage at the utility power supply is directly supplied to the load without reduction.

20. The method of claim 16, further comprising:
upon detection of a failure condition, opening each tap selection switch, subsequently closing each zero voltage reduction mode switch and connecting the normally closed contactor to the first subset of at least two taps of each regulating winding to provide a current path across the corresponding taps.

21. The method of claim 12, further comprising:
at startup,
providing a current path across the first subset of at least two taps of each regulating winding using the normally closed contactor; and
opening the zero voltage reduction mode switch in the corresponding each phase,
wherein, at startup, the voltage at the utility power supply is directly supplied to the load without reduction.

22. The method of claim 12, further comprising:
selectably controlling an auxiliary zero voltage reduction mode switch provided between a third subset of at least two of the plurality of taps of each regulating winding, wherein the auxiliary zero voltage reduction mode switch, when closed, provides a current path across the third subset of at least two taps of each regulating winding.

* * * * *